(12) United States Patent
Doetz et al.

(10) Patent No.: US 7,732,812 B2
(45) Date of Patent: Jun. 8, 2010

(54) ACTIVE SEMICONDUCTOR DEVICES

(75) Inventors: Florian Doetz, Singapore (SG); Ingolf Hennig, Neulussheim (DE)

(73) Assignee: BASF SE (DE)

( * ) Notice: Subject to any disclaimer, the term of this patent is extended or adjusted under 35 U.S.C. 154(b) by 1 day.

(21) Appl. No.: 12/089,310

(22) PCT Filed: Sep. 28, 2006

(86) PCT No.: PCT/EP2006/066826

§ 371 (c)(1),
(2), (4) Date: Apr. 4, 2008

(87) PCT Pub. No.: WO2007/039539

PCT Pub. Date: Apr. 12, 2007

(65) Prior Publication Data

US 2009/0020750 A1   Jan. 22, 2009

(51) Int. Cl.
   *H01L 35/24* (2006.01)
(52) U.S. Cl. .......................... 257/40; 257/215; 257/288; 257/642; 257/E51.001
(58) Field of Classification Search ................ 257/40, 257/215, 288, 642; 438/99
See application file for complete search history.

(56) References Cited

U.S. PATENT DOCUMENTS

| | | | |
|---|---|---|---|
| 6,713,154 B1 * | 3/2004 | Tsunogae et al. | 428/131 |
| 7,005,674 B2 | 2/2006 | Lee et al. | |
| 7,029,945 B2 | 4/2006 | Veres et al. | |
| 7,119,366 B2 | 10/2006 | Kondoh et al. | |
| 7,352,038 B2 | 4/2008 | Kelley et al. | |
| 2005/0104097 A1 | 5/2005 | Hirose et al. | |
| 2005/0259212 A1 | 11/2005 | Lee et al. | |
| 2006/0231908 A1* | 10/2006 | Liu et al. | 257/410 |

FOREIGN PATENT DOCUMENTS

| | | |
|---|---|---|
| EP | 1385218 A1 | 1/2004 |
| EP | 1494298 A2 | 1/2005 |
| EP | 1524299 A1 | 4/2005 |
| WO | WO 03/041185 A2 | 5/2003 |
| WO | WO-03/041185 A2 | 5/2003 |
| WO | WO-03/052841 A1 | 6/2003 |
| WO | WO 03/052841 A1 | 6/2003 |

OTHER PUBLICATIONS

Journal of Polymer Science, Part A vol. 34, pp. 3431-3434 (1996).

* cited by examiner

*Primary Examiner*—Wai-Sing Louie
(74) *Attorney, Agent, or Firm*—Connolly Bove Lodge & Hutz LLP

(57) ABSTRACT

Apparatus including a support body; an organic semiconductor composition body on the support body, —and a first body including a hydrogenated vinylaromatic-diene block copolymer on the organic semiconductor composition body. Apparatus including a support body, —a first body including a hydrogenated vinylaromatic-diene block copolymer on the support body; and an organic semiconductor composition body on the first body. Techniques for making an apparatus.

21 Claims, 3 Drawing Sheets

ACTIVE SEMICONDUCTOR DEVICES

RELATED APPLICATIONS

This application is a national stage application (under 35 U.S.C. 371) of PCT/EP2006/066826 filed Sep. 28, 2006, which claims benefit of U.S. application Ser. No. 11/240,298 filed Sep. 30, 2005.

FIELD OF THE INVENTION

The present invention relates to the field of active semiconductor devices, and processes for making such devices.

BACKGROUND OF THE INVENTION

Organic electronics is an emerging field of technology which aims to realize low-cost and environmentally-friendly fabrication of electronic devices. Organic field effect transistors ("FETs") are potential alternatives to amorphous silicon transistors, and may be useful for instance in relatively low-speed devices with utility as pixel drivers of active matrix displays and in radio frequency identification devices. Potential advantages to making organic FETs instead of silicon- or other inorganic-based transistors include the possibilities of large-area and low-temperature processing, which may for example help enable fabrication of electronics on flexible plastic substrates.

Films of inorganic semiconductors are often brittle and inflexible, such that their fabrication into devices may be carried out on rigid silicon wafers yielding devices that themselves are inflexible. Films formed from organic semiconductors, in contrast, are often bendable and flexible, such that their fabrication into devices may potentially be carried out by a continuous process using, for example, a flexible web support body. The resulting devices themselves also have the potential to be bendable and flexible, opening up possible end use applications that are often impracticable for inorganic semiconductor-based devices.

Electronic devices having organic semiconductor films typically include an organic dielectric film that is adjacent and bonded to at least one face of the semiconductor film. Such a dielectric film may serve, for example, as a structural support for the semiconductor film, and as an electrical insulator for the semiconductor film to prevent shorting in the devices. In the case of an FET, the dielectric film also facilitates the high capacitance needed to induce charge carrier mobility in the source-drain channel.

There is a continuing need for new organic dielectric bodies that facilitate the fabrication of active semiconductor devices providing improved performance.

SUMMARY OF THE INVENTION

In one example of an implementation, an apparatus is provided, including: a support body; an organic semiconductor composition body on said support body; and a first body including a hydrogenated vinylaromatic-diene block copolymer on said organic semiconductor composition body.

In another implementation example, an apparatus is provided, including: a support body; a first body including a hydrogenated vinylaromatic-diene block copolymer on said support body; and an organic semiconductor composition body on said first body.

As a further example, a process is provided including the steps of: providing an organic semiconductor composition body on a support body; providing a hydrogenated vinylaromatic-diene block copolymer; and depositing a first body including said hydrogenated vinylaromatic-diene block copolymer on said organic semiconductor composition body.

A more complete understanding of the present invention, as well as other features and advantages of the invention, will be apparent from the following detailed description and the accompanying drawings.

DETAILED DESCRIPTION

Examples will now be described more fully with reference to the accompanying drawings, in which several examples are shown. Various additional forms may be used, and this disclosure should not be construed as being limited to the examples of implementations set forth herein.

The term "body" is defined as a solid formed of a designated composition such as an organic semiconductor composition or an organic dielectric composition. Residual liquid medium from the formation of such bodies, and moisture, for example, may be present. The body may take the form of, for example, a wafer, layer, sheet, or elongated web. An "elongated web" is a sheet having an elongated dimension that is substantially greater than a transverse dimension. An "elongated web" may, for example, be suitable for reel-to-reel continuous processing of a high surface area having a plurality of solid bodies on the elongated web. Any of such forms of solid bodies may be monolithic or multilaminar. For example, a layer may have multiple sub-layers; and an elongated web may have multiple elongated sub webs. A "body" may have a non-uniform thickness and other non-uniform dimensions, and does not have to be completely continuous. A "body" may include one or more bodies of the same material or different materials, which may or may not interpenetrate each other, and which bodies together are referred to as the "body". There is no particular limitation on the thickness or other dimensions of a body, although bodies desirably have dimensions that are optimized for their intended function. The term "laminate" is defined as two or more bodies that are bonded together.

The term "organic" broadly means that the designated composition includes molecules, oligomers, polymers, macromolecules, or other chemical or biological species (collectively "species"), in all cases having a carbon chain that is susceptible to heat-induced structural change, particularly degradation. The carbon chain may constitute a structural skeleton for such species, or merely a partial skeleton or peripheral moiety. An organic composition may include inorganic moieties, species, and elements.

Figure 1:
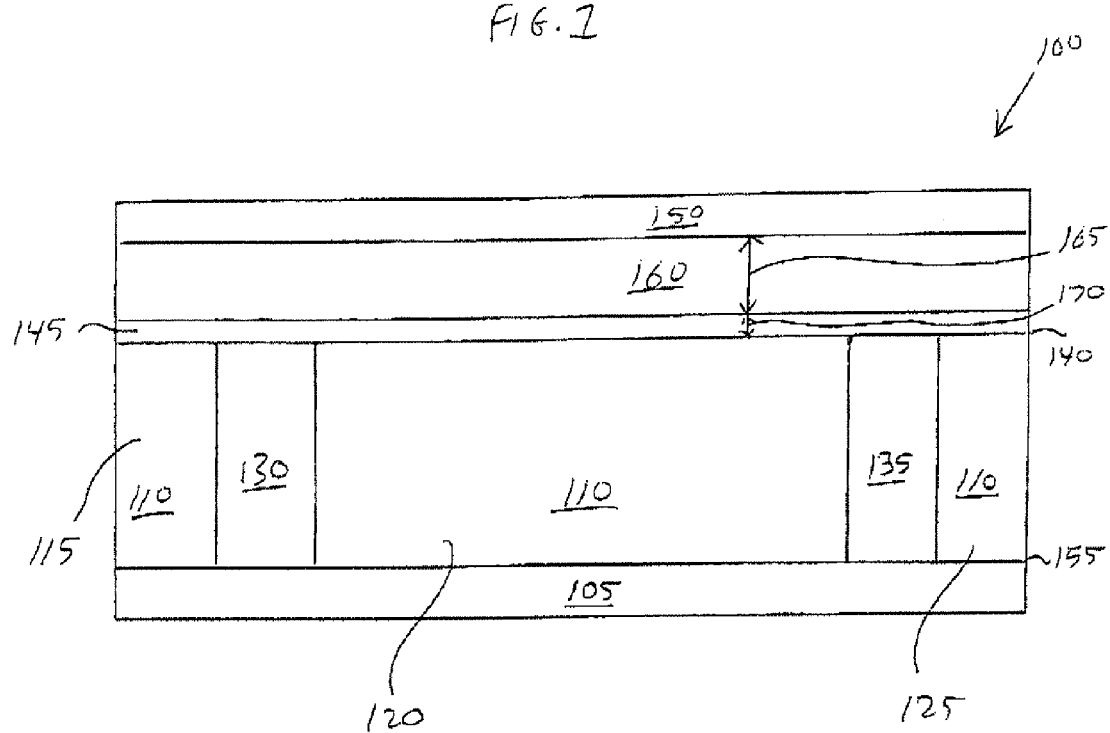
FIG. 1 shows a cross sectional perspective view of an example of a laminate including a support body, having bonded thereon an organic semiconductor composition body and a hydrogenated styrene-butadiene block copolymer composition dielectric body.

FIG. 1 shows a cross-sectional perspective view of an example of a laminate 100 including a support body 105, having bonded thereon an organic semiconductor composition body 110. Interposed between regions 115, 120 and 125 of the organic semiconductor composition body 110 on the support body 105 are source and drain electrodes 130 and 135, respectively. The organic semiconductor composition body 110 forms an interface 140 with a hydrogenated styrene-butadiene block copolymer composition ("HSBC") dielectric body 145 bonded to the semiconductor body 110. In this example, the source and drain electrodes 130 and 135 do not penetrate into the HSBC dielectric body 145, as the HSBC dielectric body 145 has a relatively low dielectric constant and may not serve as an effective electrical insulator. The organic semiconductor composition body 110 is interposed between the support body 105 and the HSBC dielectric body 145. A gate electrode 150 is bonded over the HSBC dielectric body 145. The laminate 100 may for example be fabricated by first providing the source and drain electrodes 130 and 135, respectively, on the support body 105. The source and drain electrodes may be made using various techniques such as laser ablation and offset printing. The organic semiconductor composition body 110 is then provided on the support body 105. Next, the HSBC dielectric body 145 is provided to form the interface 140 with the organic semiconductor composition body 110. The gate electrode 150 is then provided on the HSBC dielectric body 145.

As an example, the source and drain electrodes 130 and 135 respectively may be fabricated directly onto the support body 105. The source electrode 130 and drain electrode 135 may be laterally defined and mutually spaced apart along the interface 155 between the support body 105 and the organic semiconductor composition body 110, in order to avoid electrical shorting. Hence, this direct fabrication permits optimization of deposition conditions for the source electrode 130 and the drain electrode 135. Fabrication of the organic semiconductor composition body 110 prior to fabrication of the HSBC dielectric body 145 enables the realization of this direct fabrication of the source electrode 130 and the drain electrode 135 on the support body 105.

In an alternative example, a second organic dielectric composition body 160 may be interposed between the HSBC dielectric body 145 and the gate electrode 150. In this example, the second organic dielectric composition body 160 may have a relatively higher dielectric constant than does the HSBC dielectric body 145. The second organic dielectric composition body 160 may be formed of a composition suitable to form a bond with the HSBC dielectric body 145 and which does not adversely react physically or chemically with the HSBC dielectric body 145 during or after fabrication of the laminate 100.

Further information on fabrication of active devices including organic semiconductor compositions is disclosed in U.S. patent application Ser. No. 11/240,222 filed concurrently herewith by Florian Dötz, Ingolf Hennig, Jimmy Granstrom, Howard Katz, Elsa Reichmanis, Frauke Richter, and Subramanian Vaidyanathan and entitled "LIQUID PHASE FABRICATION OF ACTIVE DEVICES INCLUDING ORGANIC SEMICONDUCTORS", the entirety of which hereby is incorporated herein by reference.

The example of a laminate 100 may be operated as an FET, by connecting the source and drain electrodes 130 and 135 and the gate electrode 150 to external circuitry. In one example, access to the source electrode 130 and the drain electrode 135 for such external connections is provided by pathways made through the HSBC dielectric body 145 or the second organic dielectric composition body 160 or through both of such bodies. In another example, the support body 105 is partially removed or passageways are provided through the support body to facilitate external connections. In a further example, the HSBC dielectric body 145, the second organic dielectric composition body 160, and the gate electrode 150 may be selectively positioned, such as by deposition or printing, over the source and drain electrodes 130 and 135 so that portions of the source and drain electrodes are exposed for making electrical contacts.

The HSBC dielectric body 145 is fabricated from an organic dielectric composition comprising a substantially hydrogenated styrene-butadiene block copolymer yielding a body having a relatively low dielectric constant. In one example, the dielectric constant of the HSBC dielectric body 145 is within a range of between about 1.1 and about 3.0. In another example, the dielectric constant of the HSBC dielectric body 145 is within a range of between about 1.5 and about 2.5. In a further example, the dielectric constant of the HSBC dielectric body 145 is about 2.3.

As an example where the laminate 100 is operated as an FET, the HSBC dielectric body 145 and the second organic dielectric composition body 160 together serve as a gate dielectric for the FET, facilitating the gating function of the gate electrode 150 while minimizing leakage current and insulating the organic semiconductor composition body 110 from shorting with the gate electrode 150. In addition, the HSBC dielectric body 145 separates the organic semiconductor composition body 110 from the second organic dielectric composition body 160. The second organic dielectric composition body 160 may have a relatively high dielectric constant, so that it serves an electrical insulating function enabling the FET to provide charge carrier transport without shorting through the second organic dielectric composition body 160. Juxtaposition of the second organic dielectric composition body 160 and the organic semiconductor composition body 110 at a mutual interface without including the interposed HSBC dielectric body 145 might otherwise result in poor charge carrier mobility in the FET, due to random dipole fields present at such an interface. The high dielectric constant of the second organic dielectric composition body 160 concurrently results in the presence of relatively strong localized dipole moments within the second organic dielectric composition body 160. These strong localized dipole moments may act as traps for charge carriers, reducing the effective charge carrier mobility of the laminate 100 when utilized as an FET. Mobility may also be reduced due to broadening of the distribution of the energy states for charge carriers. In the laminate 100, therefore, the HSBC dielectric body 145 may insulate the organic semiconductor composition body 110 from the second organic dielectric composition body 160. This insulation reduces the incidence of strong localized dipole interactions at the interface 140 with the organic semiconductor composition body 110, which may permit increased charge carrier mobility in the laminate 100 when utilized as an FET.

As another example, the HSBC dielectric body may have a suitable glass transition temperature (Tg) profile to enable a substantially pinhole-free body to be formed. The styrene-butadiene block copolymers have two glass-transition-temperature related transitions for soft and hard phases. As an example, the hydrogenated styrene-butadiene block copolymer may have a soft phase Tg within a range of between about 0 degrees Centigrade (° C.) and about 20° C.; and may have a hard phase Tg within a range of between about 90° C. and about 100° C. or 120° C. Soft and hard phase Tg properties may be provided in the hydrogenated styrene-butadiene block copolymer by including blocks having low and high Tg's. As an example, the Tg of polybutadiene is about −90° C., and the Tg of polystyrene is about 100° C. Drying of the HSBC dielectric body after formation at an elevated temperature may then serve to sufficiently soften the block copolymer to enable enough flow in the HSBC dielectric body to close any pinholes created during formation of the body. As an example, the HSBC dielectric body may be annealed at a temperature of about 80-100° C. for about 10-15 minutes; or at a temperature of up to about 150° C. for about 5 minutes. As another example, the HSBC dielectric body may be heated to its Vicat softening point, so that the block copolymer starts to soften. The Tg properties of a given styrene-butadiene block copolymer may be adjusted by changing the relative proportions of styrene and butadiene in the block copolymer. Lowering the concentration of the butadiene relative to styrene may increase the Tg of the block copolymer; and lowering the concentration of the styrene relative to butadiene may decrease the Tg of the block copolymer. Following complete hydrogenation, butadiene and styrene are respectively reduced to a 4-carbon alkyl chain and a 6-carbon aliphatic ring, the latter being relatively more rigid and thus contributing a higher overall Tg to the hydrogenated block copolymer.

Adjustment of the butadiene and styrene proportions in a styrene-butadiene block copolymer may be, as an example, balanced with solvent considerations. Deposition of the styrene-butadiene block copolymer to form the HSBC dielectric body may be carried out by dissolving the block copolymer in a suitable solvent. In order to facilitate deposition of an HSBC to form a dielectric body having a selected thickness, dissolution of the block copolymer at a significantly high concentration may be helpful. As an example, a solution may have a styrene-butadiene block copolymer concentration of about 2-3% by weight; lower concentrations may yield unsatisfactory results. A concentration of at least about 5% by weight may be appropriate for spin-coating. As an example, a styrene-butadiene block copolymer concentration of at least about 10% by weight may be useful for printing of a dielectric body. In order to prepare a solution at such concentrations, an appropriate solvent is needed. Butadiene may be more highly soluble, in a variety of solvents, than styrene. Accordingly, reduction in the proportion of butadiene in a styrene-butadiene block copolymer may lead to a reduction in the solubility of the block copolymer. In one example, a non-polar solvent may be utilized, including a carbon chain having between 5 and 20 carbon atoms. As further examples, n-alkanes having between 4-12 carbons may be useful solvents. The term "n-alkanes" means one or more linear-chain alkanes having the indicated number of carbon atoms. As examples, hexane, heptane, octane, nonane, decane, undecane and dodecane may be useful.

As another example, butadiene and styrene proportions in a styrene-butadiene block copolymer may take into account the resulting structural integrity of the copolymer. As an example, the styrene content may be at least 75% by weight, or at least 90% by weight, or at least 95% by weight. A copolymer having a styrene content of less than 75%, such as, for example, a 50%/50% (weight/weight) styrene-butadiene copolymer, may be too flexible for practical utilization in making an active semiconductor device.

As a further example, the feasibility of forming an HSBC dielectric body having a smooth surface using a chosen solvent may be considered. A planar surface at the interface 140 between the HSBC dielectric body 145 and the organic semiconductor composition body 110 leads to better charge carrier mobility. A high boiling n-alkane solvent having a relatively high molecular weight, such as octane or decane, may aid in producing such a smooth surface. A lower boiling solvent may evaporate too quickly for a sufficiently smooth surface to form.

As an additional example, the styrene-butadiene block copolymer may have a number-average molar mass of at least about 20,000. As a further example, the styrene-butadiene block copolymer may have a polydispersivity (PDI) of less than about 2.00. A block copolymer with a PDI higher than about 2.00 may perform more as two different polymers than as a block copolymer, and may have an excessively high dielectric constant.

Suitable hydrogenated styrene-butadiene block copolymers and their analogs for use in making the HSBC dielectric body may as examples be any ring- and diene-hydrogenated block copolymers composed of vinylaromatic monomers and dienes forming a body having a dielectric constant within the stated ranges. It is understood throughout this specification that references to styrene-butadiene block copolymers also contemplate substitution of these analogs of styrene-butadiene block copolymers. Examples of vinylaromatic monomers which may be used are styrene, alpha-methylstyrene, ring-alkylated styrenes, such as p-methylstyrene and tert-butylstyrene, and 1,1-diphenylethylene, and mixtures of these. Examples of dienes are butadiene, isoprene, 2,3-dimethylbutadiene, 1,3-pentadiene, 1,3-hexadiene, and piperylene, and mixtures of these.

As an example, ring-hydrogenated block copolymers composed of vinylaromatic monomers and dienes may be utilized, where the block copolymers have a number-average molecular mass of at least about 40,000 grams per mole. As another example, the block copolymers may have a number-average molecular mass of at least about 60,000 grams per mole. As a further example, the block copolymers may have a number-average molecular mass of at least about 90,000 grams per mole. As an additional implementation, the average molecular weight for a single block within the block copolymer may be at least about 10,000 grams per mole.

As another example, ring-hydrogenated block copolymers composed of vinylaromatic monomers and dienes may be utilized, where the block copolymers have at least two S blocks with differing molar mass composed of vinylaromatic monomers. Such ring-hydrogenated block copolymers may contain an $S_1$ block whose molar mass $M_n$ is at least 30,000 grams per mole (g/mol), and may also contain an $S_2$ block whose molar mass $M_n$ is in the range from 5,000 to 25,000 g/mol. The $S_1$ block may as an example have a molar mass $M_n$ in the range from 30,000 to 100,000 g/mol, and the $S_2$ block may as an example have a molar mass $M_n$ in the range from 10,000 to 25,000 g/mol. As an example, the proportion of the diene units prior to the hydrogenation process may be at most 50% by weight, based on the entire block copolymer.

Prior to the hydrogenation process, in one example more than 30%, or 35 to 50%, of the block copolymerized diene units, based on the entirety of the diene units, may be present in a 1,2-vinyl form.

Besides the S blocks composed of vinylaromatic monomers, the block copolymers may have, prior to the hydrogenation process, a pure diene B block, or an S/B block copolymer block composed of vinylaromatic monomers and dienes. The block copolymer may have random distribution or have a monomer gradient.

The block copolymers may have a linear, star or comb structure. The molar mass $M_n$ of the entire block copolymer may be as an example in the range from 50,000 to 300,000 g/mol, or in the range from 80,000 to 250,000 g/mol. As examples, linear structures for the block copolymers may include the following, in which S is a vinylaromatic polymer block; B is a diene block; S/B is a block copolymer block composed of vinylaromatic monomers and diene, and which may include random distribution of the monomers; X is an oligofunctional coupling agent; and the indices 1 and 2 indicate blocks with differing molar mass or with differing monomer make-up: S-B-S/B-S, $S_1$-B-S/B-$S_2$, $S_1$-B-$S_2$, $S_1$-(S/B)$_1$-(S/B)$_2$-$S_2$, and $S_1$-(S/B)-B-$S_2$. As examples, star structures for the block copolymers may include $S_1$-B-X-B-$S_2$, $S_1$-(S/B)-B-X-B-(S/B)-$S_2$, and $S_1$-(S/B)$_1$-(S/B)$_2$-X-(S/B)$_2$-(S/B)$_1$-$S_2$.

In addition to these block copolymers, other styrene-butadiene-type block copolymers may be suitable for hydrogenation and fabrication into an HSBC dielectric body. Such block copolymers may include, as examples, styrene-butadiene three-block polymers, styrene-isoprene three-block polymers, styrene-butadiene block copolymers having 3 and 5 blocks, and styrene-isoprene block copolymers having 3 and 5 blocks. As an example, an asymmetrical block copolymer having an odd number of blocks, such as 3, 5, or 7 blocks, may provide better mechanical performance than a symmetrical copolymer having an even number of blocks. As an example, a minimum of three blocks within a block copolymer may yield superior mechanical properties. A styrene-butadiene copolymer having only two blocks may have inadequate mechanical performance. A random copolymer lacking a block structure may also yield inadequate mechanical and thermal (such as Tg) performance.

The block copolymers may be prepared by known sequential anionic polymerization of the vinylaromatic monomers and dienes in hydrocarbons, including as examples, cycloaliphatics such as cyclohexane, methylcyclohexane, or cyclopentane, or benzene. An organolithium initiator, such as n-butyllithium or sec-butyllithium may be used. The amount of vinylaromatic monomers added together with the initiator determines the molar mass Mn of the terminal blocks, e.g. $S_1$ and $S_2$. The subsequent additions of monomers, monomer mixtures, or coupling agents generally take place after complete conversion of the prior addition.

An example of a way of preparing the star-block copolymers adds initiator on two or more occasions, and adds vinylaromatic monomers simultaneously or in immediate succession. The initiator ratio for the individual additions of initiator depends on the desired ratio of the individual arms of the star. If there are two occasions of initiation, the initiator ratio $I_1/I_2$ selected may be in the range from 0.1 to 1, or in the range from 0.2 to 0.8.

After the preparation of the block copolymer, the unsaturated bonds in the diene units, and also in the vinylaromatic units of the block copolymer, are substantially hydrogenated, using a hydrogenation catalyst. Supported hydrogenation catalysts may be used. Examples of suitable support materials are inorganic substrates, such as barium sulfate, silicates, carbon, or aluminum oxides. Examples of suitable hydrogenation metals are nickel, cobalt, rhodium, ruthenium, palladium, platinum, and other group eight metals. The hydrogenation may as an example take place in a saturated hydrocarbon solvent in which the block copolymer is soluble. Cycloaliphatic hydrocarbons such as cyclohexane may be used. As an example, the solvent used may be the same as that used during the polymerization, so that the hydrogenation can take place in a step which follows the polymerization. The hydrogenation may take place batchwise or continuously, such as by continuous hydrogenation on a fixed-bed catalyst. The hydrogenation generally takes place at temperatures in the range from 40° C. to 250° C., or in the range from 120° C. to 180° C. The hydrogenation may be carried out at from atmospheric pressure to 350 bar, or in the range from 100 to 250 bar.

As an example, the degree of hydrogenation of the olefinic double bonds of the ring-hydrogenated block copolymers composed of vinylaromatic monomers and dienes may be about 97% or higher; and the degree of hydrogenation of the vinylaromatic monomers may be at least 90%, or at least 95%, or about 98%. As another example, the overall degree of hydrogenation of the block copolymer may be at least about 90%.

The second organic dielectric composition body 160 may, as examples, include any organic composition suitable to be mobilized in a liquid medium and then formed into a solid body having the necessary dielectric performance capability. However, organic dielectric compositions that cannot be so mobilized in a liquid medium may further be present, provided that they constitute a minor proportion of the organic dielectric composition. Inorganic moieties, species, and elements may also be included in the organic dielectric composition.

Example classes of suitable organic dielectric compositions include polyvinylpyrrolidone ("PVP"), polyvinylalcohol ("PVA"), and polyurethane ("PU"). The foregoing PVP and PVA polymers may be doped in the form of, for example, an aqueous dispersion, with an insulator such as $BaTiO_3$ in order to upwardly adjust the polymer's dielectric constant. $BaTiO_3$ is commercially available from Du Pont.

The term "mobilized in a liquid medium" broadly means that the designated liquid medium causes a designated solid to take on properties of a liquid or vapor. For example, the solid may be dissolved in the liquid medium to form a single phase solution. Further for example, the solid may be dispersed in the liquid medium to form a two-phase dispersion. Additionally for example, the solid and the liquid medium may be combined together to form an emulsion, suspension, gel, or micelles. The liquid medium may include moisture, as well as gases. For example, where processing is carried out under an atmosphere including an elevated concentration of nitrogen, gaseous nitrogen may become dissolved in the liquid medium. Entrainment of gases into the liquid medium is to be avoided, however, to the extent that such gases will adversely affect the chemical or physical structure of the solid phase during or after fabrication of the interface between the bodies.

In one example, the dielectric constant of the second organic dielectric composition body 160 is at least about three (3). In another example, the dielectric constant of the second body is at least about four (4). In a further example, the dielectric constant of the second dielectric body is within a range of between about six (6) and about forty (40).

As an example, relative thicknesses of the HSBC dielectric body 145 and the second organic dielectric composition body 160 are selected to maximize the performance of the laminate 100 when utilized as an FET. The second organic dielectric composition body 160 serves to insulate the gate electrode 150 from the organic semiconductor composition body 110 and from the source and drain electrodes 130 and 135, respectively. The effectiveness of the second organic dielectric composition body 160 in performing these functions in the laminate 100 increases with increasing thickness in the direction of the arrow 165, in balance with a corresponding reduction in capacitance.

The HSBC dielectric body 145, on the other hand, serves to insulate the organic semiconductor composition body 110 from localized dipole interactions with the second organic dielectric composition body 160. Hence, a minimal thickness of the HSBC dielectric body 145 in the direction of the arrow 170 may be sufficient. The capacitance of the laminate 100 is inversely proportional to the combined thicknesses of the HSBC dielectric body 145 and the second dielectric composition body 160 in the directions of arrows 170 and 165. The capacitance C of the laminate 100 is given by the formula, $1/C=1/C1+1/C2=d1/(eps0\times eps1\times A)+d2/(eps0\times eps2\times A)$, in which d1=thickness of dielectric body 145 in centimeters (cm); d2=thickness of dielectric body 160 in cm; eps1=unitless dielectric permittivity of body 145; eps2=unitless dielectric permittivity of body 160; eps0=dielectric constant, $8.85\times 10^{-12}$ Farad/meter; and A=area of body 145 or 160 in $cm^2$. Hence, as an example, the HSBC dielectric body 145 may be relatively thin in the direction of arrow 170, the second dielectric composition body 160 may be relatively thick in the direction of the arrow 165, and the combined thicknesses of these bodies in the direction of such arrows may be selected to provide a balance between adequate capacitance without excessive leakage current. As an example, the HSBC dielectric body may have a thickness within a range of between about 30 nanometers (nm) and about 150 nm in the direction of arrow 170; and the second organic dielectric composition body 160 may have a thickness within a range of between about 1 micron (μ) and about 15μ in the direction of arrow 165. As another example, the second organic dielectric composition body 160 may have a thickness within a range of between about 10μ and about 15μ in the direction of arrow 165 when prepared by spin coating.

The support body 105 may generally be formed from any material suitable for providing structural support directly to the organic semiconductor composition body 110 and indirectly to the HSBC dielectric body 145 and second dielectric composition body 160. The support body 105 may be rigid or flexible as needed for compatibility with the process for fabricating the laminate 100 and for compatibility with its intended end-use. In one example, the support body 105 is an elongated web formed of aluminum, a glass, or a polymer. Suitable polymers for this purpose include, for example, poly (ethylene terephthalate) generally referred to as PET (such as MYLAR® commercially available from E.I. du Pont de Nemours & Company or Melinex® available from Du Pont Teijin Films), polyethylene naphthalate ("PEN"), poly(ethylene terephthalate)-poly(ethylene naphthalate) block copolymer ("PET/PEN"), and polyimides (such as Kapton® also commercially available from E.I. du Pont de Nemours & Company).

The organic semiconductor composition includes one or more organic semiconductors. In general, any organic semiconductor composition suitable to be formed into an organic semiconductor composition body may be utilized. Inorganic moieties, species, and elements may also be included in the organic semiconductor composition. Suitable organic semiconductors may include, as examples, poly(9,9'-dioctylfluorene-co-bithiophene) ("F8T2") and 6,13-bis(triisopropylsilylethynyl)pentacene ("TIPS"). Further thiophene compositions that may be suitable include: regioregular poly (3-hexylthiophene); and 1,4-bis(5-(5-hexylthien-2-yl)thien-2-yl)benzene (DHT4Ph). DHT4Ph can, e.g., be synthesized according to procedures described for hexylated 5- and 6-ring compositions in W. Li et al., Chem. Mater., Vol. 11, pp. 458 et seq. (1999), hereby incorporated in its entirety by reference, using 1,4-diiodobenzene as the source of the benzene ring. In addition, naphthalene-N,N-dialkyl-1,4,5,8-tetracarboxylic diimide compositions may be suitable for use in the organic semiconductor composition. Further, poly(3,3'''-dioctylterthiophene) ("PTT-8") and derivatives may be used. In addition, poly(3,3'''-dodecylquaterthiophene) ("PQT-12"), having the following molecular structure, may be used:

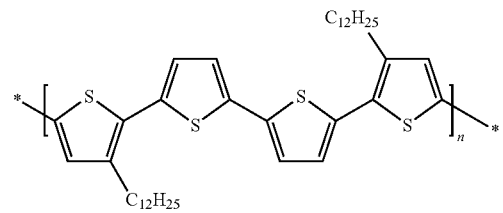

Further organic semiconductor compositions that may be utilized are disclosed in Published PCT Patent Application No. WO 03/052841, dated Jun. 26, 2003 and entitled "Organic Field Effect Transistor With an Organic Dielectric". It is to be understood that the foregoing classes and species of semiconductors may be used, if available, in monomeric, oligomeric, and polymeric forms, provided however in each case that they must be soluble as that term is defined herein.

PTT-8 and its derivatives may be synthesized according to procedures disclosed in B. S. Ong et al., "Poly(3,3''-dialkylterthiophene)s: Room-Temperature, Solution-Processed, High-Mobility Semiconductors for Organic Thin-Film Transistors", Chem. Mater. Vol. 17, pp. 221-223 (2005), the entirety of which is hereby incorporated herein by reference.

Figure 2:
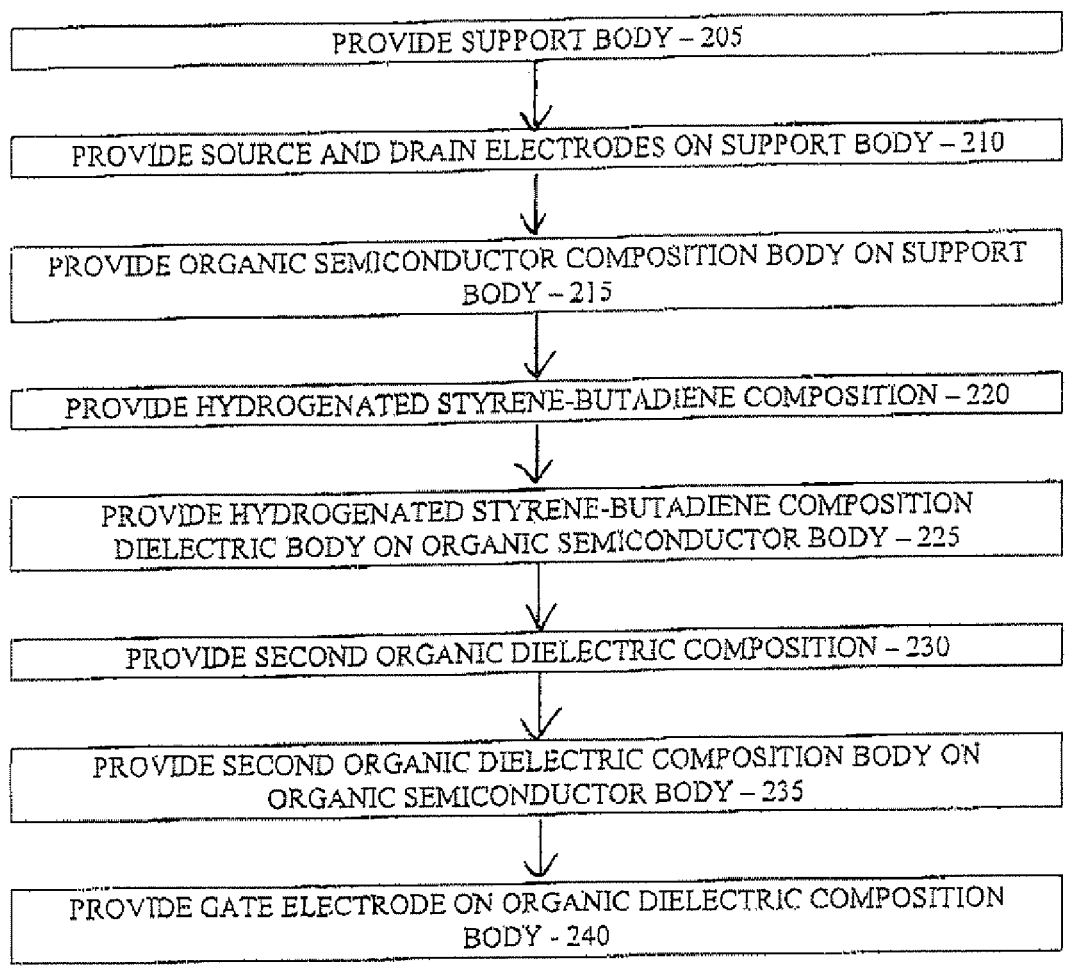
FIG. 2 shows an example of a process for fabrication of the laminate shown in FIG. 1.

FIG. 2 shows an example of a process 200 for fabrication of the laminate 100. In step 205, a support body 105 is provided as earlier discussed. In step 210, source and drain electrodes 130 and 135, respectively, are provided on the support body 105. The source electrode 130 and drain electrode 135 may be formed in any suitable manner on the support body 105. For example, a selected charge carrier conductive composition such as a metal or metal alloy including copper, aluminum, gold, silver, platinum, palladium, and/or nickel, may be electroplated or vaporized and deposited through a mask onto the support body 105. Alternatively, a conductive body formed from a selected charge carrier conductive composition may be deposited by any suitable process onto the support body 105, such as by electrodeposition, direct coating, or sputtering, and then selectively etched. Further, a selected charge carrier conductive polymer such as polyethylenethioxythiophene ("PEDOT"), may be mobilized by a suitable solvent and printed onto the support body 105. In step 215, an organic semiconductor composition body 110 is provided on the support body 105. The organic semiconductor composition body 110 may be formed in any suitable manner on the support body 105, as discussed in connection with FIG. 1.

In step 220, a hydrogenated styrene-butadiene block copolymer composition is selected and mobilized in a liquid medium. As an example, the hydrogenated styrene-butadiene block copolymer may be formulated as a solution in a high boiling non-polar solvent. In one example, the non-polar solvent may include a carbon chain having between 5 and 20 carbon atoms. In another example, the non-polar solvent may include a carbon chain having between 4 and 12 carbon atoms. In a further example, the non-polar solvent may be hexane, heptane, octane, or a mixture.

In step 225, the hydrogenated styrene-butadiene block copolymer composition, as mobilized in the liquid medium, is applied onto the organic semiconductor composition body 110. In one example, a spin-casting process is employed to apply the hydrogenated styrene-butadiene block copolymer composition in order to form the HSBC dielectric body 145.

The liquid medium may then be removed, for example, by directing an inert gas such as nitrogen over the laminate 100. Heat may also be applied.

In step 230, a second organic dielectric composition is selected and mobilized in a liquid medium. The second organic dielectric composition is employed to form a second organic dielectric body 160. The second organic dielectric composition may be selected to form a body having a relatively high dielectric constant compared with that of the HSBC dielectric body 145. The HSBC dielectric body 145 may also be thin as discussed earlier, thus serving as a sub-optimum dielectric barrier.

In step 235, the second organic dielectric composition, as mobilized in the liquid medium, is applied onto the HSBC dielectric body 145. In one example, a spin-casting process is employed to apply the second organic dielectric composition in order to form the second organic dielectric body 160. The liquid medium may then be removed in the same manner as discussed in connection with step 225.

In step 240, the gate electrode 150 is provided on the second dielectric composition body 160. The gate electrode 150 may be formed in any suitable manner on the second dielectric composition body 160. For example, a selected charge carrier conductive composition as discussed earlier may be vaporized or solvated and deposited onto the second dielectric composition body 160. Vaporization, if employed, is carried out with care to minimize disturbance of the second organic dielectric composition. The selected charge carrier conductive composition may be deposited by any other suitable process onto the second dielectric composition body 160. Masking and etching processes or printing processes may be carried out if desired, for example if multiple laminates 100 are being simultaneously fabricated on an integral support body 105. As a further example, steps 230 and 235 may be omitted.

Figure 3:
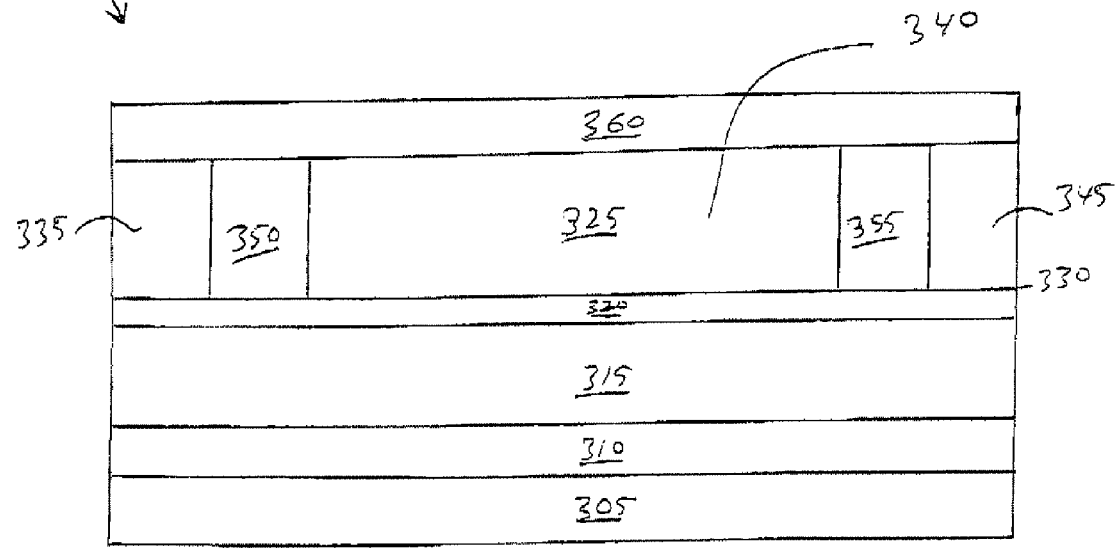
FIG. 3 shows a cross-sectional perspective view of an example of a laminate including a support body, having bonded thereon a hydrogenated styrene-butadiene block copolymer composition dielectric body and an organic semiconductor composition body.

FIG. 3 shows a cross-sectional perspective view of an example of a laminate 300 having a support body 305 having bonded thereon a gate electrode 310. An organic dielectric composition body 315 and an HSBC dielectric body 320 are bonded on the gate electrode 310. The organic dielectric composition body 315 is interposed between the gate electrode 310 and the HSBC dielectric body 320. In this example, the organic dielectric composition body 315 may have a relatively higher dielectric constant than does the HSBC dielectric body 320. The organic dielectric composition body 315 may be formed of a composition suitable to form a bond with the HSBC dielectric body 320 and which does not adversely react physically or chemically with the HSBC dielectric body 320 during or after fabrication of the laminate 300. An organic semiconductor composition body 325 is bonded on the HSBC dielectric body 320. Accordingly, the HSBC dielectric body 320 is interposed between the organic dielectric composition body 315 and the organic semiconductor composition body 325. The organic semiconductor composition body 325 is bonded to and forms an interface 330 with the HSBC dielectric body 320. Interposed between regions 335, 340 and 345 of the organic semiconductor composition body 325 on the HSBC dielectric body 320 are source and drain electrodes 350 and 355, respectively. In this example, the source and drain electrodes 350 and 355 do not penetrate into the HSBC dielectric body 320, as the HSBC dielectric body 320 has a relatively low dielectric constant and may not be an effective electrical insulator. A passivation layer 360 may be bonded onto the organic semiconductor composition body 325 and the source and drain electrodes 350 and 355, respectively. The laminate 300 may be fabricated by carrying out the process 200 as discussed above, in an analogous manner.

The example of a laminate 300 may be operated as an FET, by connecting the source and drain electrodes 350 and 355 and the gate electrode 310 to external circuitry. In one example, access to the source electrode 350 and the drain electrode 355 for such external connections is provided by pathways made through the passivation layer 360. In another example, such access is provided by pathways through the HSBC dielectric body 320 or the organic dielectric composition body 315 or through both.

Figure 4:
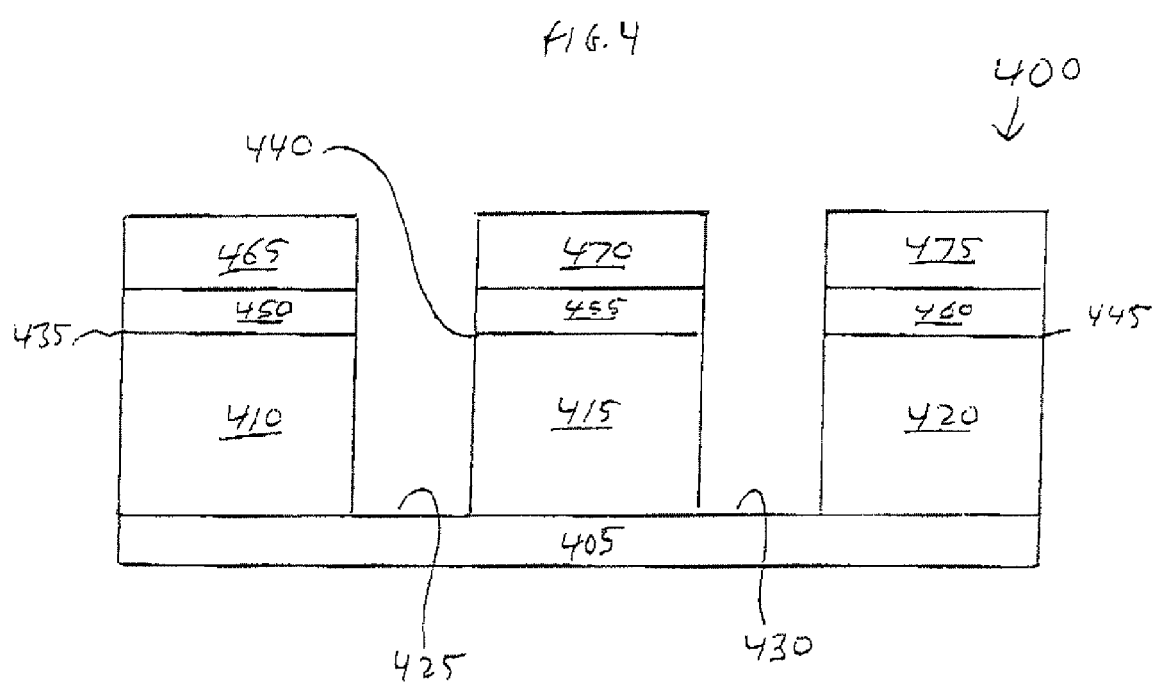
FIG. 4 shows a cross-sectional side view of an example of a laminate including a support body, having bonded thereon a plurality of organic semiconductor composition bodies and a plurality of hydrogenated styrene-butadiene block copolymer composition bodies over intermittent regions of the support body.

FIG. 4 shows a cross-sectional side view of an example of a laminate 400 having a support body 405 having bonded thereon a plurality of organic semiconductor composition bodies 410, 415 and 420 over intermittent regions of the support body 405. A plurality of exposed regions 425 and 430 of the support body 405 serve to mutually space apart the organic semiconductor composition bodies 410, 415 and 420. The organic semiconductor composition bodies 410, 415 and 420 respectively form interfaces 435, 440 and 445 with HSBC dielectric bodies 450, 455 and 460 respectively bonded to the semiconductor bodies 410, 415 and 420. The organic semiconductor composition bodies 410, 415 and 420 are interposed between the support body 405 and the HSBC dielectric bodies 450-460, respectively. Second dielectric composition bodies 465, 470 and 475 are bonded on HSBC dielectric bodies 450-460, respectively. The laminate 400 may for example be fabricated by first providing the organic semiconductor composition bodies 410, 415 and 420 on the support body 405, and then providing the HSBC dielectric bodies 450-460 in registration with the organic semiconductor composition bodies 410, 415 and 420 to form the interfaces 435-445, respectively. The HSBC dielectric bodies 450-460 thus insulate the organic semiconductor bodies 410, 415 and 420 from the relatively high dielectric constant of the second dielectric composition bodies 465-475, respectively. In this regard, the support body 405 as shown in FIG. 4 is a representative portion of an elongated web on which the laminate 400 may be fabricated on a continuous basis in any desired length.

In one example, the process 200 is carried out on an elongated web in order to produce a plurality of laminates 400. The elongated web may, for example, be suitable for reel-to-reel continuous processing of a high surface area having a plurality of laminates 400 in a spaced apart array on the elongated web. In one example, the laminates 400 have example exposed regions 425 and 430. In this case, the organic semiconductor composition is intermittently applied onto the support body 405 to form the representative organic semiconductor composition bodies 410, 415 and 420. The HSBC and the second organic dielectric composition may then be successively applied onto the organic semiconductor composition bodies 410, 415 and 420, and if desired, may also be applied over the representative exposed regions 425 and 430 of the support body 405 to form an elongated body of the organic dielectric composition. Alternatively, the organic semiconductor composition bodies 410, 415 and 420 may be integrated into an elongated organic semiconductor composition body on the support body 405, and the HSBC dielectric bodies 450-460 and the second organic dielectric composition bodies 465-475 may be integrated into an elongated bi-layer dielectric composition body on the support body 405. In the latter case an elongated four-body laminate is formed. Referring to FIGS. 1 and 3, the laminates 100 and 300 may analogously constitute elongated multi-body laminates.

In one example, the process 200 is carried out on an elongated web in order to produce a plurality of laminates 400 using a continuous gravure printing process. Gravure, a type of intaglio printing, makes use of the ability of ink to adhere to shallow scratches and depressions on a polished metal plate. In one example, rotogravure is used, employing a web press equipped with a cylindrical metal plate that rotates on its axis. A web or sheet of a selected elongated support body passes between the rotating cylindrical plate and an impression roll, transferring ink onto the elongated support body. Gravure inks generally have a low viscosity in order to allow them to be drawn into engraved cells on the metal gravure plate and then be transferred onto the elongated support body. High volume air dryers are placed in position to then dry the ink prior to any subsequent additional printing steps. Water-based inks require a higher drying temperature and longer drying time than do inks employing more volatile solvents having a higher vapor pressure.

In another example, the process 200 is carried out on an elongated web in order to produce a plurality of laminates 400, using a continuous offset printing process. For example, offset gravure or offset lithography may be used. In offset printing processes, ink is not applied directly from a printing plate or cylinder to the elongated support body. Instead, ink is applied to the printing plate to form the image to be printed, and is then transferred to a rubber blanket. The image on the blanket is then transferred to the elongated support body. In lithography, the intended image areas of the printing plate or cylinder are treated to make them selectively hydrophobic, and the remaining surface area of the plate or cylinder remains hydrophilic. An aqueous fountain solution is then applied to the plate or cylinder to wet the hydrophilic regions and prevent subsequent adherence of a hydrophobic ink to them. A hydrophobic ink composition is then applied to the image areas of the plate or cylinder. The image is then successively transferred to the offset blanket and then to the elongated support body. Printing inks for offset lithography generally are viscous and paste-like, in order to reduce their flow beyond the image areas onto the non-image hydrophobic areas.

Other printing processes may be used. For example, ink jet printing may be used. However, ink jet printing is generally imprecise and implicates transfer of ink particles across a distance onto the body, which typically is not optimum for a continuous fabrication process.

The organic semiconductor composition bodies, the HSBC dielectric bodies, and the second organic dielectric composition bodies may be fabricated on the support body in each case using a printing ink including the respective compositions. The solvents employed in making such inks are desirably selected to have boiling points that are not too low or too high. In one example, the solvents have boiling points within a range of between about 50° C. and about 200° C. In another example, the solvents have boiling points within a range of between about 60° C. and about 150° C. If the solvent boiling point is too high, then evaporation of the solvent after printing of the ink becomes problematic. If the solvent boiling point is too low, then the composition may also be tacky at moderate temperatures such that its physical structure remains unstable. The surface tension of the printing ink needs to be sufficiently low so that the ink may wet the support body surface and be separated from the support body surface, and if employed, the offset blanket. In one example of gravure printing, an ink is used having a surface tension within a range of between about 22 milli-newtons per meter ("mN/m") and about 32 mN/m; and having a viscosity within a range of between about 40 milliPascals per second ("mPas") and about 800 mPas. In one example of offset printing, an ink is used having a surface tension within a range of between about 30 mN/m and about 60 mN/m; and having a viscosity within a range of between about 5000 mPas and about 100,000 mPas.

Example 1

An asymmetric linear block copolymer having the block structure $S_1$-$B_1$-$S_2$ was synthesized. $S_1$, $S_2$ and $B_1$ were 830 grams of styrene, 415 grams of styrene, and 284 grams of butadiene, respectively. The synthesis steps were carried out in a 10 liter stirred vessel, using standard inertization techniques. First, 4,790 ml of dry cyclohexane formed an initial charge in the vessel and were heated to 50° C. A precalculated amount of 7.9 ml sec-butyllithium solution (1.5 mol/l) and tetrahydrofuran (0.4% by volume, based on the amount of cyclohexane) were added, and then the solution was stirred for a further 5 minutes. Portions of anhydrous styrene and butadiene were added in succession to the reaction solution to build up the blocks. The reaction time to build up a styrene block was 15 minutes, while that for a butadiene block was 40 minutes. The polymerization was terminated by adding 3 ml of isopropanol. Kerobit TBK (2,6-di-tert-butyl-p-kresol) in an amount of 0.1% based on the solids content of the block copolymer of was added to stabilize the material.

The butadiene content, 14%, was determined by means of infrared spectroscopy. The proportion of 1,2-linkage in the polybutadiene block was 57%. The number-average molar mass $M_n$ was 151,000. The polydispersivity PDI was 1.18. $M_n$ and PDI were determined by means of gel permeation chromatography (GPC) relative to polystyrene standards. The glass transition temperature Tg of the block copolymer was −54° C. and 98° C. for the soft and hard phases, respectively. The block copolymers have two glass-transition-temperature related transitions Tg for the soft and hard phase, which were determined by differential scanning calorimeter measurements in the range from −100° C. to 230° C.

Example 2

The asymmetric linear block copolymer synthesized in Example 1, having the block structure $S_1$-$B_1$-$S_2$ was hydrogenated and characterized. First, a hydrogenation catalyst, (5% of Pt on activated carbon), was prepared. 2.09 kg (calculated dry weight) of activated carbon (Norit SX Plus) were slurried, with stirring, in 16.72 kg of deionized water. To this mixture was added a solution of 0.1864 kg of Pt(II) nitrate, comprising 0.110 kg of Pt, in 2.140 kg of deionized water. The suspension was heated to 50° C., while stirring. To reduce the platinum, 3.136 1 of a 5% strength hydrazine hydrate solution were then added, and the mixture was then stirred at 50° C. for a further 30 minutes. It was then cooled, filtered, and washed with water until free from nitrate (conductivity>20 micro Siemens). The catalyst was then dried in a vacuum drying cabinet for 54 h at 110° C.

Second, the block copolymer synthesized in Example 1 was hydrogenated using a 5 liter autoclave. 3.3 1 of a 6% strength polymer solution in cyclohexane were charged to the autoclave. 41 g of the hydrogenation catalyst (5% Pt/C) were carefully added. After a pressure check, hydrogen was first introduced under pressure until the pressure was 50 bar, and the temperature was increased to 220° C. The hydrogen pressure was then adjusted in stages up to 250 bar. A hydrogenation time of 48 hours started once the operating pressure had been achieved. Any fall in pressure during this period was corrected by introducing further hydrogen under pressure. Once the hydrogenation time ended, the suspension was removed from the pressure vessel. The catalyst was removed by filtration, using a pressure-filtration funnel.

The degree of hydrogenation of aromatic bonds in the block copolymer was 99.4%. This degree of hydrogenation of the aromatic unsaturated bonds was determined by comparing the UV signal intensities in the gel permeation chromatography (GPC) plots of specimens prior to and after the hydrogenation process. The degree of hydrogenation of the double bonds in the diene units was above 99%. There was substantially no molar mass degradation. Molar mass degradation was determined by comparing the RI signal intensities in the GPC plots of specimens prior to and after the hydrogenation process. The glass transition temperature Tg of the hydrogenated block copolymer was −63° C. and 140° C. for the soft and hard phases, respectively. Softening point (Vicat B), determined according to ISO 306 (1994), was 115° C.

The dielectric constant of the hydrogenated block copolymer (unitless) at room temperature in air was about 2.3; and the volume resistivity (Ωcm) after 10 minutes drying at 80° C. was <4×10$^8$. All dielectric constant data herein are unitless and were measured in accordance with IEC standard 60250. Volume resistivity was measured according to IEC 60093. Throughout this specification, reported dielectric constants and volume resistivities were determined for dielectric bodies standing alone. For each measurement of dielectric constant and volume resistivity, the organic dielectric composition was spin coated onto indium-tin oxide ("ITO")-coated glass and suitably dried to form a body. The ITO coating served as one electrode, and the other electrode was applied as a layer of conducting silver or carbon paint or colloidal graphite. The volume resistivity needs to be relatively high in order to insulate the gate electrode from the source and drain electrodes at the small dielectric body thicknesses employed.

Example 3

An FET was fabricated having a structure consistent with that shown in FIG. 1, including an HSBC dielectric body formed by using the hydrogenated styrene-butadiene-type block copolymer produced in Examples 1 and 2, and a second organic dielectric composition body corresponding to bodies 145 and 160 respectively. This FET was fabricated using the process described in connection with FIG. 2. The support body used was a block copolymer PEN foil attached to a glass slide with scotch tape. The source and drain electrodes were offset printed with PEDOT, at an average thickness of about 1 micron (μ). The organic semiconductor composition body used was spin coated from a 3% weight/weight solution in o-xylene of F8T2, and had an average thickness of about 60 nm after drying at 100° C. for 15 minutes. The first-deposited HSBC dielectric body 145 was a 2% weight/weight solution in hexane of the hydrogenated block copolymer of styrene and butadiene formulated as a solution in n-alkanes having between four and twelve carbon atoms. This HSBC dielectric body was dried at 70° C. for 15 minutes. The second-deposited dielectric body 160 was spin coated Luxprint® polymer paste including BaTiO$_3$, having an average thickness of about 9μ. The second organic dielectric composition body 160 was dried at 70° C. for 15 minutes. The gate electrode was carbon ink painted onto the second organic dielectric composition body 160. The resulting FET was connected into an external circuit. The mobility of the FET was 3.2×10$^{-3}$ cm$^2$/Vs, and the on/off ratio, calculated from the output characteristics, was 5291.

Example 4

Another FET was prepared in the same manner as in Examples 1, 2 and 3, except that the source and drain electrodes were offset printed and the first-deposited HSBC dielectric body 145 was a 2% weight/weight solution in hexane of the same hydrogenated block copolymer of styrene and butadiene formulated as a solution in n-alkanes having between four and twelve carbon atoms, which was cured for about 5 minutes at about 80° C. to remove the solvent; and the F8T2 was annealed to 80° C. after deposition to form the organic semiconductor composition body 110. The resulting FET was connected into an external circuit. The mobility of the FET was 8.1×10$^{-3}$ cm$^2$/Vs, and the on/off ratio, calculated from the output characteristics, was 13,100.

Example 5

An additional FET was prepared in the same manner as in Examples 1 and 2; an HSBC dielectric body was included, but the second organic dielectric composition body was omitted. The support body used was a block copolymer PEN foil attached to a glass slide with scotch tape. The source and drain electrodes were offset printed with PEDOT, at an average thickness of about 1μ. The organic semiconductor composition body used was spin coated from a 3% weight/weight solution in o-xylene of F8T2, and had an average thickness of about 60 nm after drying at 100° C. for 15 minutes. The HSBC dielectric body was deposited from a 2% weight/weight solution in hexane of the hydrogenated block copolymer of styrene and butadiene. This process was repeated four times using different concentrations (2×2%, 10%, 2%) to reach a sufficient thickness of the film. The HSBC dielectric body was dried at 50° C. for 30 minutes. The gate electrode was carbon ink painted onto the organic dielectric composition body. The resulting FET was connected into an external circuit. The mobility of the FET was 3.6×10$^{-3}$ cm$^2$/Vs, and the on/off ratio, calculated from the output characteristics, was 8.

Example 6

An additional FET was prepared in the same manner as in Examples 1 and 2. The support body used was a poly(ethyleneterephthalate) ("PET") foil attached to a glass slide. The source and drain electrodes were fabricated from laser patterned PE-DOT, at an average thickness of about 0.3μ. The organic semiconductor composition body used was spin coated from a 5% weight/weight solution in tetrahydrofuran (THF) of 5,5'-bis(4-(1-methylhexyloxy)phenyl)-2,2'-bithiophene ("1-MH-PTTP"), and had an average thickness of about 200 nm. The first-deposited organic dielectric composition body was a 5% weight/weight solution in heptane of the hydrogenated block copolymer of styrene and butadiene. The organic dielectric composition body was dried at 80° C. for 5 minutes. The second-deposited organic dielectric composition was spin coated from an aqueous solution of PVA (containing 11% butylglycol) of about 5,400 nm. This organic dielectric composition body was dried at 80° C. for 34 minutes. The gate electrode was silver ink painted onto the organic dielectric composition body. The resulting FET was connected into an external circuit. The mobility of the FET was 6.4×10$^{-6}$ cm$^2$/Vs, and the on/off ratio, calculated from the output characteristics, was 2.

Example 7

An additional FET was prepared in the same manner as in Examples 1 and 2. The support body used was a poly(ethyleneterephthalate) ("PET") foil attached to a glass slide. The source and drain electrodes were fabricated from laser patterned PE-DOT, at an average thickness of about 0.3μ. The organic semiconductor composition was prepared by dissolving 0.25 g of F8T2 and 0.5 g of polystyrene (molecular weight 2,000,000) in 14.25 g of THF. This solution was spin coated to give a film with an average thickness of about 1,750 nm after drying at 80° C. for 5 minutes. The first-deposited organic dielectric composition body was a 5% weight/weight solution in heptane of the hydrogenated block copolymer of styrene and butadiene. The organic dielectric composition body was dried at 80° C. for 5 minutes. The second-deposited organic dielectric composition was spin coated from an aqueous solution of PVA, having an average thickness of about 3,500 nm. This organic dielectric composition body was dried at 80° C. for 30 minutes. The gate electrode was silver ink painted onto the organic dielectric composition body. The resulting FET was connected into an external circuit. The mobility of the FET was $5.7 \times 10^{-5}$ cm$^2$/Vs, and the on/off ratio, calculated from the output characteristics, was 5. Further information on fabrication of active devices utilizing organic semiconductor compositions including polystyrene additives is disclosed in U.S. patent application Ser. No. 11/240,733 filed concurrently herewith by Florian Dotz, Ingolf Hennig and Frauke Richter and owned by BASF Aktiengesellschaft, entitled "ORGANIC COMPOSITIONS", the entirety of which hereby is incorporated herein by reference.

Example 8

Another asymmetric linear block copolymer, having the block structure $S_1$-$B_1$-$S_2$-$B_2$-$S_3$ was synthesized. $S_1$, $B_1$, $S_2$, $B_2$ and $S_3$ were 371 grams of styrene, 243 grams of butadiene, 371 grams of styrene, 243 grams of butadiene and 371 grams of styrene, respectively. The synthesis steps were carried out in a 10 liter stirred vessel, using standard inertization techniques. First, 4,790 ml of dry cyclohexane formed an initial charge in the vessel and were heated to 50° C. A precalculated amount of 9.7 ml sec-butyllithium solution (1.5 mol/l) and tetrahydrofuran (0.4% by volume, based on the amount of cyclohexane) were added, and then the solution was stirred for a further 5 minutes. Portions of anhydrous styrene and butadiene were added in succession to the reaction solution to build up the blocks. The reaction time to build up a styrene block was 15 minutes, while that for a butadiene block was 40 minutes. The polymerization was terminated by adding 1.2 ml of isopropanol. Kerobit TBK (2,6-di-tert-butyl-p-kresol) in an amount of 0.1% based on the solids content of the block copolymer of was added to stabilize the material.

The number-average molar mass $M_n$ was 122,000. The polydispersivity PDI was 1.13. $M_n$ and PDI were determined by means of gel permeation chromatography (GPC) relative to polystyrene standards. The glass transition temperature Tg of the hydrogenated block copolymer was –60° C. and 138° C. for the soft and hard phases, respectively. The asymmetric linear block copolymer was then hydrogenated and characterized. First, a hydrogenation catalyst was prepared. Next, the block copolymer was hydrogenated. The degree of hydrogenation of aromatic and double bonds in the block copolymer was greater than 99%. There was substantially no molar mass degradation. The glass transition temperature Tg of the hydrogenated block copolymer was –60° C. and 138° C. for the soft and hard phases, respectively. Softening point (Vicat B), determined according to ISO 306 (1994), was 115° C.

For an example of a p-type semiconductor capable of transporting holes, electrical conductivity is approximated by the formula $\sigma = en\mu_d$ where $\mu_d$ is the carrier mobility, e is the charge on the carriers, and n is the density of free carriers. Conductivity accordingly is proportional to mobility. Mobility may readily be measured, and the corresponding conductivity may be approximated. Conductivity in a device having an organic semiconductor depends on the size and separation of crystal grains. The size distribution of crystal grains determines how many of them must be effectively traversed by a charge carrier in order to be transported from an origin to a destination such as between a source and a drain, for example. The separation between crystal grains determines the impact of non-crystalline regions on conductivity. For example, crystal grains separated by a distance greater than the maximum inter-grain tunneling distance for a particular semiconductor material may constitute a nonconductive pathway for charge carriers. Conductivity within a crystal grain of an organic semiconductor also depends on charge carrier energy levels and molecular overlaps in the crystal.

Since conductivity is proportional to mobility for materials with one charge carrier type, and mobility may be directly measured, the mobility is generally considered to be the most important parameter for characterization of transistors such as FETs The On/Off ratio is generally considered to be the second most important parameter. The measurements of the FETs fabricated as reported above were performed with a Hewlett-Packard 4155A Semiconductor Parameter Analyzer.

The following formula was used to determine the mobility, in linear regime, of the transistors fabricated in accordance with Examples 1 and 2.

$$\mu = (\partial I_{ds}/\partial Vg) \cdot (L/WciV_{ds}) \quad (2)$$

In formula (2), $I_{ds}$ is the drain-source (or source-drain) current in the linear regime (|Vd|<|Vg|). Vg is the gate electrode voltage, $Vd_{ds}$ is the source-drain voltage, $C_i$ is the gate insulator capacitance per unit area, L is the channel length, W is the channel width, and ∂ a denotes a partial derivative. The voltages for the measurement of the output characteristics were varied in the following range: $0V \geq Vds \geq -60$ V (10 V steps), $10 V \geq Vgs \geq -60$ V (10 V steps). The gate insulator capacitance in the FETs was directly measured by probes attached to the Hewlett-Packard inductance-capacitance-resistance meter. The W/L ratio was measured using an optical microscope.

While the present invention has been disclosed in a presently preferred context, it will be recognized that the present teachings may be adapted to a variety of contexts consistent with this disclosure and the claims that follow. For example, although specific examples of implementations have been discussed with respect to FETs, other active electronic devices may be fabricated.

We claim:

1. An apparatus comprising: a support body; an organic semiconductor composition body on said support body; and a first body consisting essentially of a hydrogenated vinylaromatic-diene block copolymer on said organic semiconductor composition body.

2. The apparatus of claim 1, further including; a second organic dielectric composition body on said first body.

3. An apparatus consisting essentially of: a support body; a first body comprising a hydrogenated vinylaromatic-diene block copolymer on said support body; an organic semiconductor composition body on said first body, and a second organic dielectric composition body is interposed between the support body and the first body.

4. The apparatus of claim 1, wherein the vinylaromatic-diene block copolymer includes styrene and butadiene.

5. The apparatus of claim 1, wherein the vinylaromatic-diene block copolymer includes styrene and butadiene.

6. The apparatus of claim 1, wherein the first body has a dielectric constant within a range between about 1.1 and about 3.0.

7. The apparatus of claim 2, wherein the second organic dielectric composition body has a dielectric constant of at least about 3.0.

8. The apparatus of claim 3, wherein the first body has a dielectric constant within a range between about 1.1 and about 3.0.

9. The apparatus of claim 3, wherein the second organic dielectric composition body has a dielectric constant of at least about 3.0.

10. The apparatus of claim 1, wherein a degree of hydrogenation of diene moieties of the block copolymer is at least about 97%; and a degree of hydrogenation of vinylaromatic moieties of the block copolymer is at least about 90%.

11. The apparatus of claim 3, wherein a degree of hydrogenation of diene moieties of the block copolymer is at least about 97%; and a degree of hydrogenation of vinylaromatic moieties of the block copolymer is at least about 90%.

12. The apparatus of claim 4, wherein the first body has a dielectric constant within a range between about 1.1 and about 3.0 and the second organic dielectric composition body has a dielectric constant of at least about 3.0.

13. The apparatus of claim 5, wherein the first body has a dielectric constant within a range between about 1.1 and about 3.0 and the second organic dielectric composition body has a dielectric constant of at least about 3.0.

14. The apparatus of claim 12, wherein a degree of hydrogenation of diene moieties of the block copolymer is at least about 97%; and a degree of hydrogenation of vinylaromatic moieties of the block copolymer is at least about 90%.

15. The apparatus of claim 13, wherein a degree of hydrogenation of diene moieties of the block copolymer is at least about 97%; and a degree of hydrogenation of vinylaromatic moieties of the Hock copolymer is at least about 90%.

16. An apparatus comprising: a support body; an organic semiconductor composition body on said support body; and a first body comprising a hydrogenated vinylaromatic-diene block copolymer on said organic semiconductor composition body, and wherein the hydrogenated vinylaromatic-diene block copolymer is mobilized in at least one n-alkane having between about 4 and about 12 carbon atoms.

17. An apparatus comprising: a support body; an organic semiconductor composition body on said support body; and a first body comprising a hydrogenated vinylaromatic-diene block copolymer on said organic semiconductor composition body, wherein the hydrogenated vinylaromatic-diene block copolymer is comprised of at least 75% by weight styrene.

18. The apparatus of claim 1, wherein the first body consists of a hydrogenated vinylaromatic-diene block copolymer on said organic semiconductor composition body.

19. The apparatus of claim 1, wherein the hydrogenated vinylaromatic-diene block copolymer is comprised of at least 75% by weight styrene.

20. The apparatus of claim 1, wherein the hydrogenated vinylaromatic-diene block copolymer is comprised of at least 90% by weight styrene and butadiene.

21. The apparatus of claim 1, wherein the hydrogenated vinylaromatic-diene block copolymer is comprised of at least 95% by weight styrene and butadiene.

* * * * *